United States Patent
Wunch et al.

(10) Patent No.: US 10,082,162 B2
(45) Date of Patent: Sep. 25, 2018

(54) VOLTAGE DETECTOR SWITCH

(71) Applicant: K.T.I. HYDRAULICS, INC., Santa Ana, CA (US)

(72) Inventors: Jim Wunch, Hungtingon Beach, CA (US); Chun Nien King, Irvine, CA (US)

(73) Assignee: K.T.I. Hydraulics, Inc., Santa Ana, CA (US)

( * ) Notice: Subject to any disclaimer, the term of this patent is extended or adjusted under 35 U.S.C. 154(b) by 0 days.

(21) Appl. No.: 15/377,968

(22) Filed: Dec. 13, 2016

(65) Prior Publication Data
US 2017/0089369 A1   Mar. 30, 2017

Related U.S. Application Data

(63) Continuation-in-part of application No. 14/618,878, filed on Feb. 10, 2015, now Pat. No. 9,443,400.

(51) Int. Cl.
| | |
|---|---|
| *F15B 19/00* | (2006.01) |
| *F15B 1/26* | (2006.01) |
| *F15B 11/08* | (2006.01) |
| *F15B 13/02* | (2006.01) |
| *F15B 13/044* | (2006.01) |

(Continued)

(52) U.S. Cl.
CPC .............. *F15B 19/005* (2013.01); *F15B 1/26* (2013.01); *F15B 11/08* (2013.01); *F15B 13/024* (2013.01); *F15B 13/044* (2013.01); *F15B 21/08* (2013.01); *G01R 31/3606* (2013.01); *G01R 31/3689* (2013.01); *G08B 5/36* (2013.01); *G08B 21/182* (2013.01); *G08B 25/10* (2013.01);

(Continued)

(58) Field of Classification Search
CPC ...... F15B 11/08; F15B 13/024; F15B 13/044; F15B 19/005; F15B 1/26; F15B 21/08; F15B 2211/20507; F15B 2211/30525; F41B 11/723; F41B 11/724; G01K 15/00; G01K 15/005; G01K 7/14; H04W 4/008
USPC ........... 340/663, 636.15, 636.1, 635, 636.19, 340/636.11–636.14, 648, 3.1, 825.23, 340/825.29
See application file for complete search history.

(56) References Cited

U.S. PATENT DOCUMENTS

| | | | |
|---|---|---|---|
| 4,015,572 A * | 4/1977 | Leshner ................. | F02M 69/18 123/430 |
| 5,605,109 A * | 2/1997 | Merten .................. | B63H 25/30 114/150 |

(Continued)

*Primary Examiner* — Daniel Previl
(74) *Attorney, Agent, or Firm* — Charles C. H. Wu; Charles C.H. Wu & Assoc., APC

(57) ABSTRACT

A voltage detector assembly employed in hydraulic systems, comprising a hydraulic power unit having a hydraulic cylinder with a piston, a hydraulic fluid reservoir connected with the hydraulic cylinder, a pump operated by a motor connected with the hydraulic fluid reservoir and a wireless module. A battery is connected to the hydraulic power unit by means of a start solenoid that transfers power from the battery to the motor of the hydraulic power unit. A digital remote is connected to the hydraulic power unit and the battery through the start solenoid. The digital display registers available battery power in volts during upstroke and down stroke of the hydraulic system. The wireless module includes a radio frequency (RF) wireless unit and a Bluetooth transmitter/receiver that allows a user to measure the battery voltage level through wireless communication.

31 Claims, 7 Drawing Sheets

(51) Int. Cl.
*F15B 21/08* (2006.01)
*G01R 31/36* (2006.01)
*G08B 5/36* (2006.01)
*G08B 21/18* (2006.01)
*G08B 25/10* (2006.01)
*G01R 19/165* (2006.01)
*H04W 4/80* (2018.01)

(52) U.S. Cl.
CPC .............. *F15B 2211/20507* (2013.01); *F15B 2211/30525* (2013.01); *H04W 4/80* (2018.02)

(56) References Cited

U.S. PATENT DOCUMENTS

| | | | | |
|---|---|---|---|---|
| 5,775,273 | A * | 7/1998 | Beale | F02B 71/00 |
| | | | | 123/46 B |
| 6,454,033 | B1 * | 9/2002 | Nathan | B60K 17/02 |
| | | | | 180/307 |
| 2005/0061574 | A1 * | 3/2005 | Torizawa | B62D 5/0484 |
| | | | | 180/421 |
| 2006/0040791 | A1 * | 2/2006 | Nakajima | F16H 63/502 |
| | | | | 477/111 |
| 2013/0041563 | A1 * | 2/2013 | Komiya | F16H 61/0021 |
| | | | | 701/60 |
| 2013/0303191 | A1 * | 11/2013 | Pasquero | H04W 68/00 |
| | | | | 455/456.3 |

* cited by examiner

VOLTAGE DETECTOR SWITCH

RELATED APPLICATIONS

This application is related to and is intended as a continuation in part of U.S. Non-provisional patent application Ser. No. 14/618,878 filed on Feb. 10, 2015. The disclosure of this application is incorporated herein as if set out in full.

BACKGROUND OF THE DISCLOSURE

Technical Field of the Disclosure

The present embodiment is related in general to voltage detectors, and in particular to a system for detecting battery voltage level utilizing a wireless module having a radio frequency (RF) wireless unit and a Bluetooth receiver connected with a digital remote and a start solenoid of a hydraulic power unit.

Description of the Related Art

Hydraulic systems enable an operator to accomplish significant work (lifting heavy loads, turning a shaft, drilling precision holes, etc.) with a minimum of mechanical linkage. Battery-operated hydraulic systems are found in a wide variety of applications, from small assembly processes to integrated steel and paper mill applications. These hydraulic power systems offer convenience and versatility, in connection with utility vehicles, utility units, utility trailers and other hydraulically powered equipment. Many operators prefer a battery-powered hydraulic system as it replaces manual pumping by the operator to actuate the hydraulics and, thus involves less physical effort. After a period of continued operation or non-use of hydraulic systems, the battery loses voltage. Currently, the operator has no way of knowing the status of the battery when operating the hydraulic systems. Thus, the battery voltage can drop below the minimum voltage level for operation, and continued operation can cause damage to other components. Damage may include overflow of fluid from a reservoir tank, arcing across the contact points which can melt the metal, cause damage to the starter solenoid, the melting of the insulation, increasing the current producing excessive heat, causing damage to the motor, and could potentially cause a fire. Therefore, one of the most critical requirements for battery-operated hydraulic systems is the development of a reliable and economical way to monitor battery functionality so as to increase the life and reduce potential damage of battery-powered hydraulic systems. In addition another objective would be to identify the status of battery readiness, which describes what the level of power a battery can deliver at any given moment.

The battery voltage level is a key parameter for determining the operating state of the battery. Battery monitoring also serves to protect medical, defense, and communication devices, as well as wheeled mobility and electric vehicle applications. Battery monitoring allows the operator to determine when the operation of the hydraulic system should be stopped, and when the battery needs to be charged to prevent damage to the hydraulic system.

One existing voltage detecting system provides an apparatus for diagnosing a low voltage battery which includes a high voltage battery for powering an electric automobile, a voltage converter that reduces the output of the high voltage battery to a low voltage, a low voltage battery for powering the auxiliaries of the automobile, a current/voltage sensor, a controller, and a warning indicator. The controller diagnoses the degradation of the low voltage battery at the start of the operation of the automobile by referring the output of the current/voltage sensor to a set of selected predetermined reference values.

Another existing system provides a handheld, wired remote control unit for battery-operated hydraulic power systems. The remote control unit comprises a hydraulic actuator command circuit, a battery level control circuit and an audio/visual operator assistance module.

Yet another existing battery voltage detector discloses a system and method for detecting low battery voltage supplied to a battery operated integrated circuit. A stable reference voltage provided by a bandgap reference is compared with the battery voltage. However, the above-described voltage detector systems do not monitor battery voltage in real-time and the user is not able to discontinue the operation of a voltage less hydraulic system causing damages. Further, such conventional systems are complicated in design and thus the maintenance cost is very high. Such voltage detection systems do not possess any wireless communication technique to detect the battery voltage reading. The wireless communication technique mainly benefits a remote user to measure the status of the battery level. Further, such systems do not prevent arcing across the contact points and probable damage to the starter solenoid or the motor, creating a potential fire hazard. Moreover, such systems do not provide a signal when the battery needs to be charged.

In light of the foregoing, there is a need for a voltage detection system that would detect the voltage across the battery terminals of a battery-powered hydraulic system. Such a needed system would give the status of the battery when operating the hydraulic system and leading to the prevention of damage of the hydraulic system. Such a needed system would monitor the minimum voltage level to the hydraulic system in real-time and prevent the overflow of fluid from the reservoir tank. This system would prevent arcing across the contact points and thereby prevent damage to the starter solenoid and the motor and would eliminate a fire hazard. Such a needed system would allow a user to determine when the operation of the hydraulic system should be stopped and when the battery needs to be charged. Moreover, such a system would enable a remote user to detect the voltage level through wireless communication method. Such a system would be cost effective and help preventing any damage to the machinery thereby avoiding the need for replacement of damaged parts. The present embodiment accomplishes these objectives.

SUMMARY OF THE INVENTION

To minimize the limitations found in the prior art, and to minimize other limitations that will be apparent upon the reading of the specifications, the preferred embodiment of the present invention provides a system for real-time detection of battery voltage level in a hydraulic power unit through a wireless communication method.

The hydraulic power unit comprises a hydraulic fluid reservoir containing a hydraulic fluid. The hydraulic fluid reservoir has a pair of control valves and a pair of relief valves. The pair of control valves includes a load holding valve and a directional control valve. The pair of relief valves includes a primary relief valve and a secondary relief valve. The hydraulic fluid reservoir is connected with a hydraulic cylinder with a rod end and a bore end. The hydraulic cylinder has a piston positioned inside. A pump operated by a motor is connected with the hydraulic fluid reservoir. The pump pumps the hydraulic fluid from the hydraulic fluid reservoir to the hydraulic cylinder.

A battery is connected to the hydraulic power unit by means of a start solenoid. A digital remote is further connected to the hydraulic power unit and the battery through the start solenoid. The digital remote has a digital display that registers available battery power in volts during upstroke and down stroke of the hydraulic system power unit. The digital remote informs the operator when the available power is insufficient to operate the hydraulic power unit.

The hydraulic power unit features a wireless module having a radio frequency (RF) wireless unit and a Bluetooth transmitter/receiver. The wireless module allows the user to detect the battery voltage level through a wireless communication. The wireless module is connected with the digital remote and the start solenoid. The RF wireless unit and the Bluetooth receiver are located within the cable housing at the point where the solenoid cable and the digital remote cable are joined. The wireless module registers the available voltage level in the battery of the hydraulic power unit and transmits the detected voltage level to a portable security device wirelessly coupled with the wireless module. The wireless module is very beneficial to the user who is far away from the hydraulic unit and is not able to take the voltage reading from the digital remote. The portable security device is designed to interface with the hydraulic power unit. The portable security device includes but not limited by a key fob or a cell phone. In the preferred embodiment, the key fob includes a key fob upper button, a key fob down button and a key fob display. If the user is utilizing the key fob as the portable security device then the user presses the key fob up button to know the voltage reading across the battery during the upstroke of the hydraulic cylinder. Similarly, the user presses the key fob down button to know the voltage reading across the battery during the down stroke of the hydraulic cylinder. The key fob display displays the voltage levels. And if the user is utilizing the cell phone as the security device then the cell phone must be installed with a voltage detection software application with an interface having an up and down buttons and a reading display similar to that of the key fob. In the preferred embodiment, in order to interface with the hydraulic power unit, the cell phone must have a security function and the key fob must have a built-in communication feature. If the voltage level received from the security device is very low then the user stops the operation of the hydraulic power unit and recharges the battery immediately. An added feature of the preferred embodiment is that the digital remote can co-exist with the wireless module. Alternatively, the hydraulic power unit can be set up with only the wireless option or only with the hardwired digital remote. Thus, the hydraulic power unit of the preferred embodiment possesses two devices, the digital remote and the wireless module, to detect the voltage level real-time battery thereby enabling the user to protect the hydraulic unit from low voltage damages.

A first objective of the present invention is to provide a battery-powered hydraulic unit with a voltage detection assembly that detects the voltage across the battery terminals.

A second objective of the present invention is to provide a hydraulic unit that gives the status of the battery in real time during operation thereof A third objective of the present invention is to provide a hydraulic unit that prevents arcing across the contact points thereby preventing damage to the start solenoid and the motor and eliminating fire hazard.

A fourth objective of the present invention is to provide a hydraulic unit that allows measuring the battery voltage level wirelessly utilizing a wireless module.

Another objective of the present invention is to provide a hydraulic unit that enables the user to detect the voltage status even if the user is far from the unit.

Yet another objective of the present invention is to provide a hydraulic unit that enables the user to receive the voltage level utilizing a key fob or a cell phone.

A further objective of the present invention is to provide a hydraulic unit that is cost effective and avoids the need for replacement of damaged parts.

These and other advantages and features of the present invention are described with specificity so as to make the present invention understandable to one of ordinary skill in the art.

BRIEF DESCRIPTION OF THE DRAWINGS

Elements in the figures have not necessarily been drawn to scale in order to enhance their clarity and improve understanding of these various elements and embodiments of the invention. Furthermore, elements that are known to be common and well understood to those in the industry are not depicted in order to provide a clear view of the various embodiments of the invention, thus the drawings are generalized in form in the interest of clarity and conciseness.

DETAILED DESCRIPTION OF THE DRAWINGS

In the following discussion that addresses a number of embodiments and applications of the present invention, reference is made to the accompanying drawings that form a part hereof, and in which is shown by way of illustration specific embodiments in which the invention may be practiced. It is to be understood that other embodiments may be utilized and changes may be made without departing from the scope of the present invention.

Various inventive features are described below that can each be used independently of one another or in combination with other features. However, any single inventive feature may not address any of the problems discussed above or only address one of the problems discussed above. Further, one or more of the problems discussed above may not be fully addressed by any of the features described below.

Figure 1:
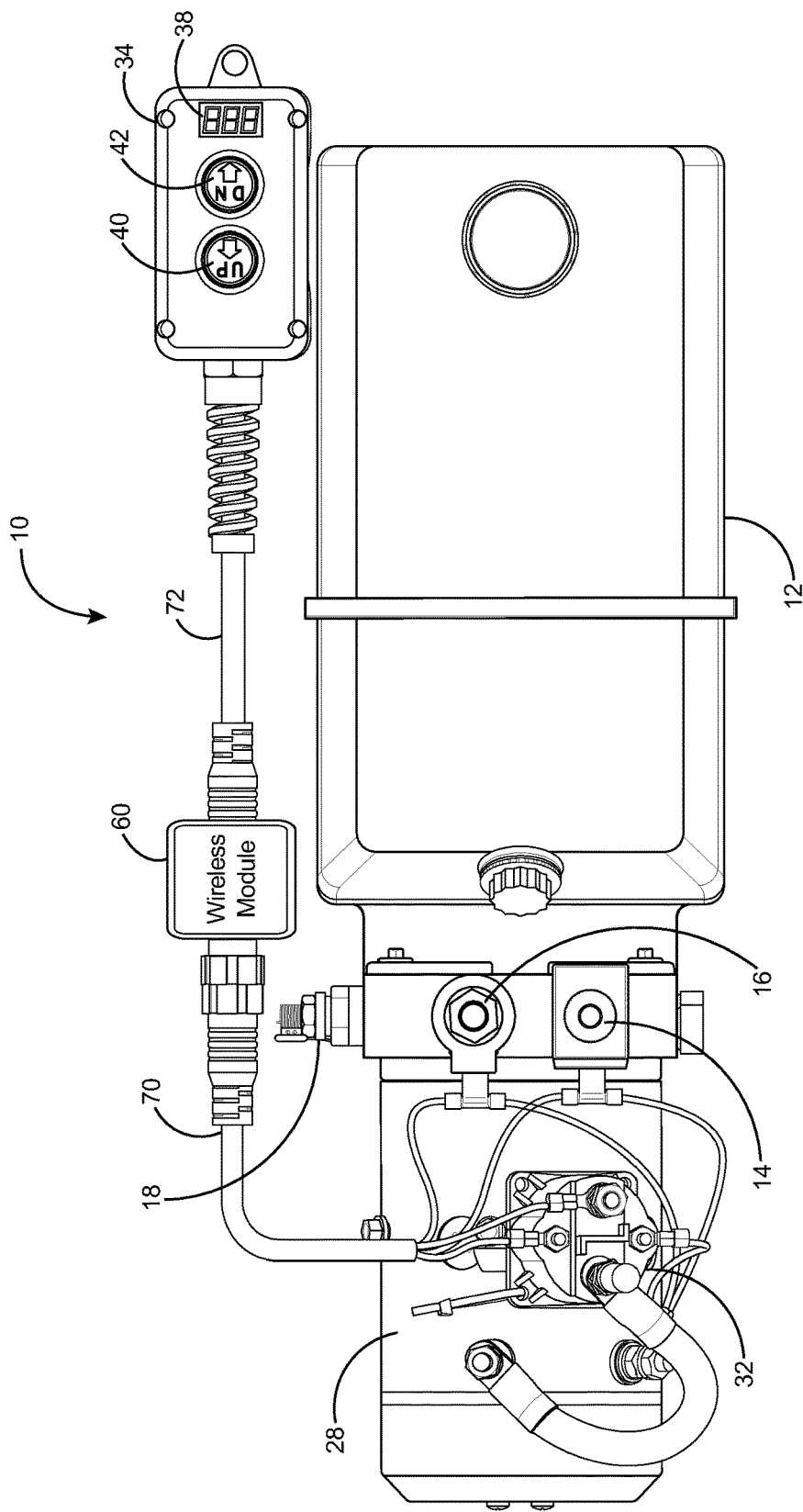
FIG. 1 is a front perspective view of a preferred embodiment of a hydraulic power unit.

FIG. 1 is a front perspective view of a hydraulic power unit 10. The hydraulic power unit 10 comprises a hydraulic fluid reservoir 12 having a hydraulic fluid. For optimum performance and system life, hydraulic fluid with anti-wear properties, rust and oxidation inhibitors, foam inhibitors and good stability must be used. Examples of premium grade hydraulic oils are Chevron Rando HDZ, Mobil DTE 10, DTE 20 series, AMSOIL, and Shell Tellus. The hydraulic fluid reservoir 12 has a pair of control valves 14, 16 and a pair of relief valves 18, 20. The hydraulic fluid reservoir 12 is connected with a hydraulic cylinder 22 (See FIG. 6) with a rod end 44 and a bore end 46. The hydraulic cylinder 22 has a piston 24 positioned inside the cylinder 22. A pump 26 operated by a motor 28 is connected with the hydraulic fluid reservoir 12. The pump 26 pumps the hydraulic fluid from the hydraulic fluid reservoir 12 to the hydraulic cylinder 22.

A battery 30 (See FIG. 7) is connected to the hydraulic power unit 10 by means of a start solenoid 32. The start solenoid 32 transfers power from the battery 30 to the motor 28 of the hydraulic power unit 10. A digital remote 34 is further connected to the hydraulic power unit 10 and the battery 30 through the start solenoid 32. The digital remote 34 has a digital display 38 that registers available battery power in volts during upstroke and down stroke of the hydraulic power unit 10. The digital remote 34 informs the operator about the low power level of battery 30 and the hydraulic power unit 10 needs to be discontinued from operation.

Figure 2:
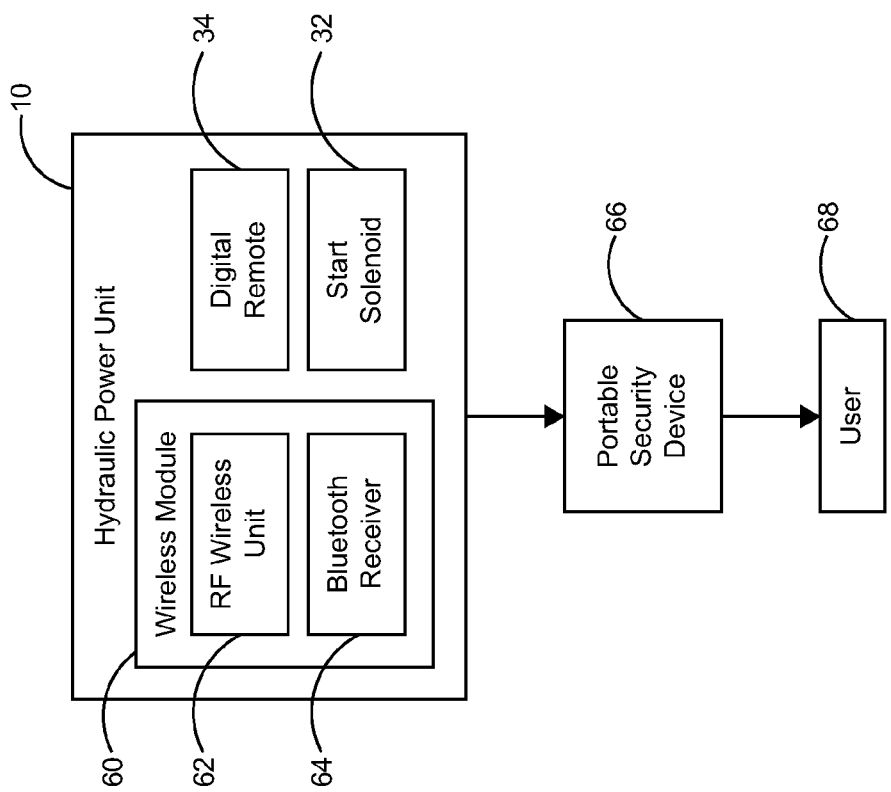
FIG. 2 is a block diagram of the hydraulic power unit, illustrating a wireless module connected with a digital remote and a start solenoid of the preferred embodiment.

As shown in FIGS. 1 and 2, the hydraulic power unit 10 includes a wireless module 60 having a radio frequency (RF) wireless unit 62 (see FIG. 2) and a Bluetooth transmitter/receiver 64 (see FIG. 2). The wireless module 60 detects the voltage status of the hydraulic power unit 10 similar to the digital remote 34 but through RF and Bluetooth communication. The wireless module 60 is connected with the digital remote 34 and the start solenoid 32. The RF wireless unit 62 and the Bluetooth receiver 64 are located within the cable housing at the point where the solenoid cable 70 and the digital remote cable 72 are joined. The wireless module 60 transmits the battery voltage level of the hydraulic power unit 10 to a portable security device though a wireless communication. The portable security device 66 (see FIG. 2) is wirelessly coupled with the wireless module 60. The portable security device 66 may be a key fob or a cell phone. The portable security device 66 is designed to interface with the hydraulic power unit 10. The key fob includes a key fob upper button, a key fob down button and a key fob display. The key fob is adaptable to make RF or Bluetooth communication and alerts the user 68 about the low battery voltage. If the user 68 is utilizing the key fob as the portable security device 66, the key fob up button is then pressed to measure the voltage reading across the battery 30 during the upstroke of the hydraulic cylinder 22. Similarly, the user 68 presses the key fob down button to measure the voltage reading across the battery 30 during the down stroke of the hydraulic cylinder 22. The key fob display displays the battery voltage level. If the user 68 utilizes the cell phone as the security device 66 then the cell phone must be installed with a voltage detection software application with an interface having an up and down buttons and a reading display similar to that of the key fob.

In order to interface with the hydraulic power unit 10, the cell phone must have a security function and the key fob must have a built-in communication feature. In the preferred embodiment, the digital remote 34 can co-exist with the wireless module 60. Alternatively, the hydraulic power unit 10 can be set up with only the wireless option or only the hardwired digital remote 34. The wireless module 60 is more beneficial for a remote user 68 who is far from the hydraulic unit 10. In use, the user 68 checks the available voltage level in the key fob or cell phone and if the measured value is very low, the user 68 takes immediate action to discontinue the operation of the hydraulic unit 10 thereby preventing the possible damages to the hydraulic unit 10.

Figure 3:
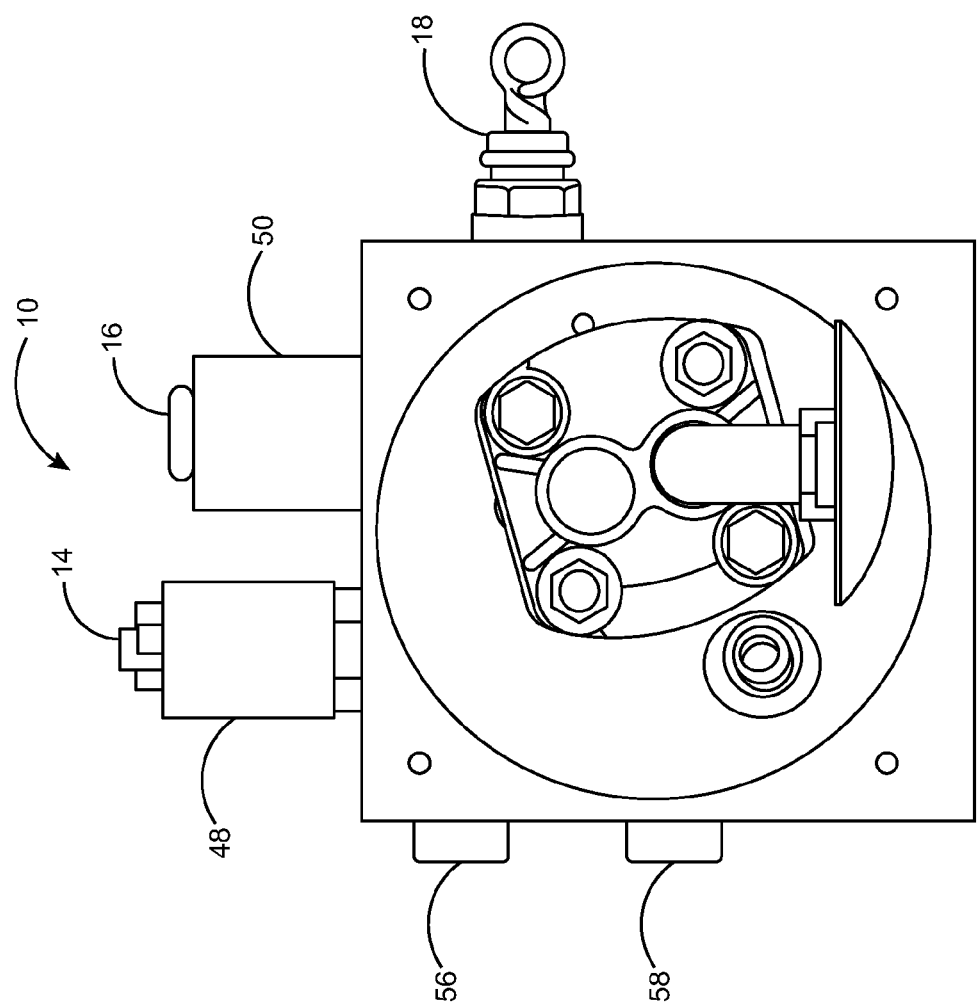
FIG. 3 is a side perspective view of the preferred embodiment of the hydraulic power unit.

Turning to FIG. 3, a side perspective view of the hydraulic power unit 10 is illustrated. The pair of control valves 14, 16 includes a load holding valve 14 and a directional control valve 16. The load holding valve 14 checks the rod end 44 and the bore end 46 of the cylinder 22. A square coil 48 in the load holding valve 14 allows retraction of the cylinder 22. The directional control valve 16 controls the direction of the hydraulic fluid. By activating a round coil 50 of the directional control valve 16, the flow path of the fluid can be changed.

The pair of relief valves 18, 20 includes a primary relief valve 18 and a secondary relief valve 20. The relief valves 18, 20 prevent over pressurization of hydraulic power unit 10. The secondary relief valve 20 is placed after the primary relief valve 18 to prevent thermal expansion and over pressurization of the cylinder 22 which may result in catastrophic failure.

Figure 4:
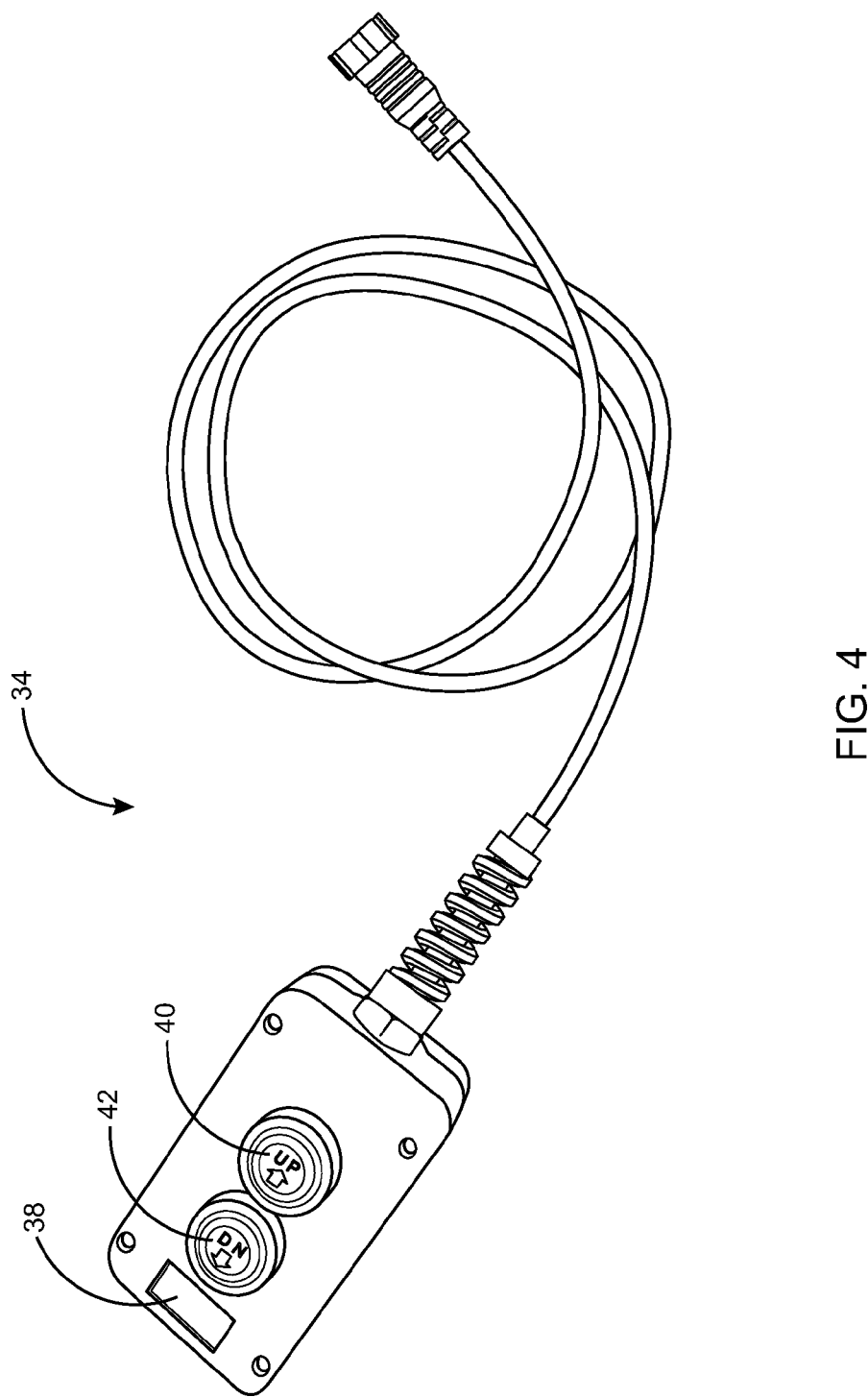
FIG. 4 is a perspective view of the digital remote connected to the hydraulic power unit.
Figure 5:
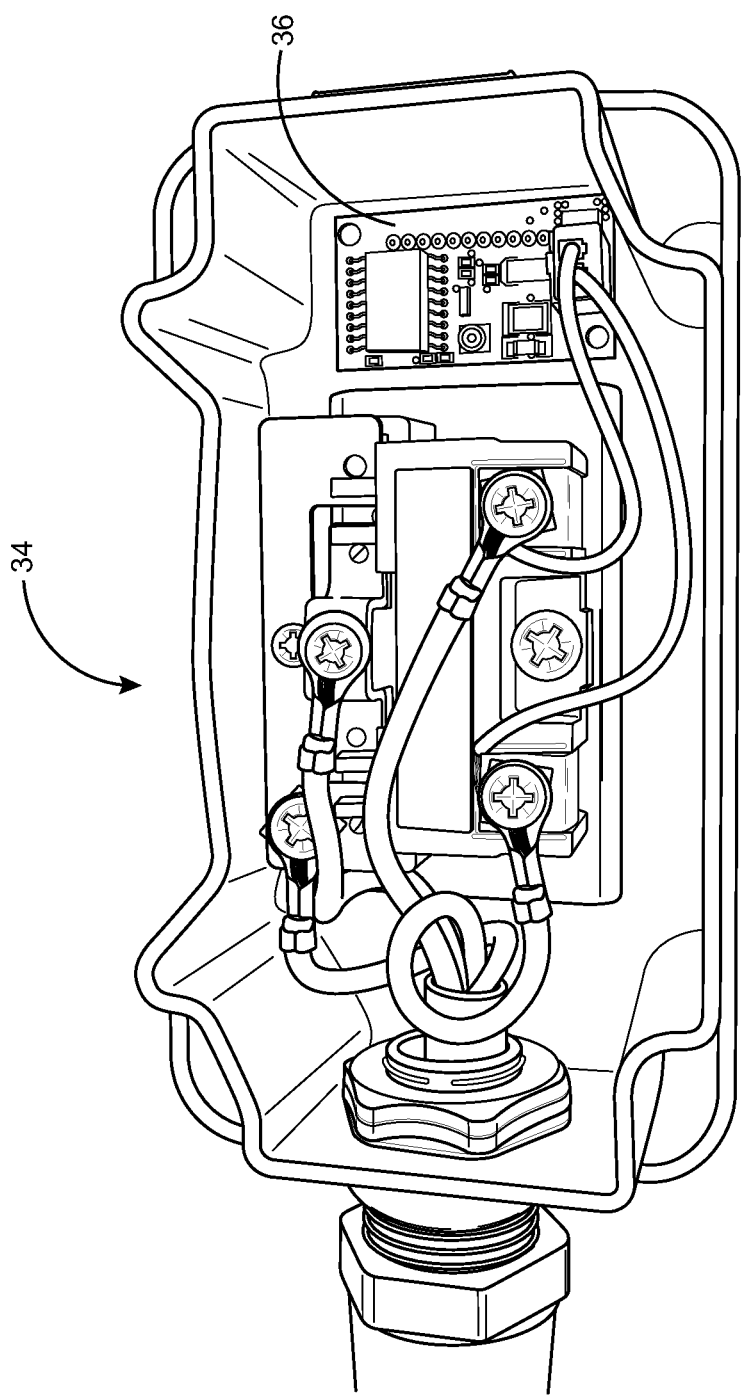
FIG. 5 is a sectional view of the digital remote connected to the hydraulic power unit.

FIGS. 4 and 5 illustrate perspective and sectional views of the digital remote 34 connected to the hydraulic power unit 10. The digital remote 34 includes a circuit board 36, a digital display 38, a remote up button 40 and a remote down button 42. Pressing the remote up button 40 provides voltage reading across the battery 30 (See FIG. 7) during the upstroke of the hydraulic cylinder 22. Pressing the remote down button 42 provides the voltage reading during the down stroke of the hydraulic cylinder 22.

Figure 6:
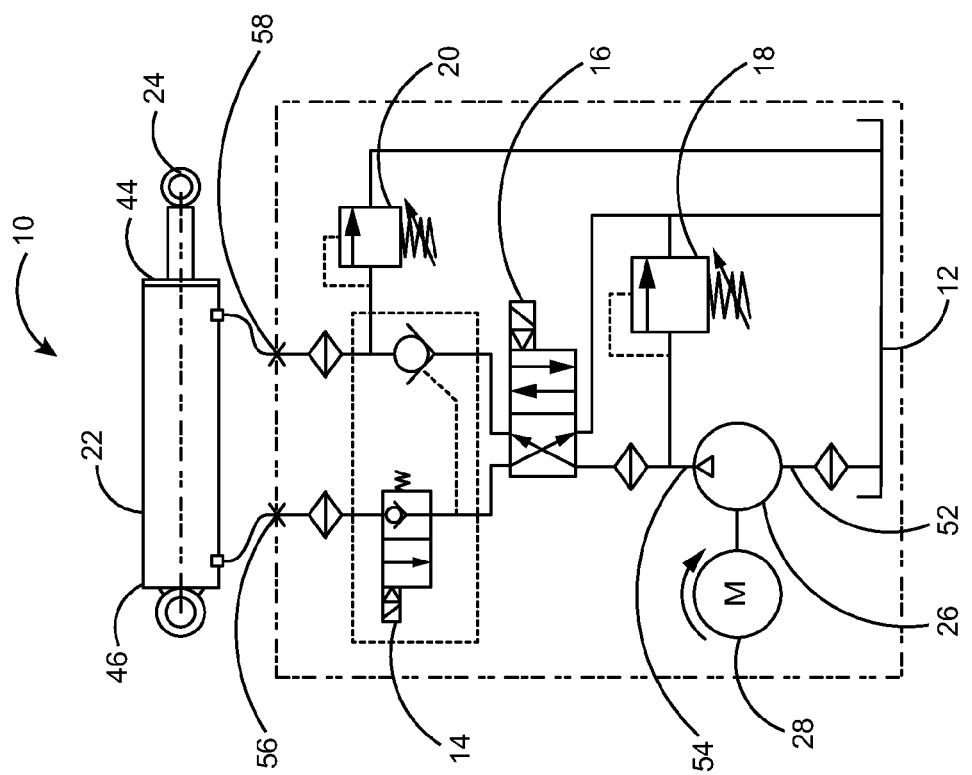
FIG. 6 is a schematic diagram of the hydraulic power unit.

FIG. 6 is a schematic diagram of the hydraulic power unit 10. For assembling the hydraulic power unit 10, the motor 28 is connected to the pump 26. An inlet 52 of the pump 26 is then connected to the reservoir 12 and an outlet 54 of the pump 26 is connected to the rod end 44 of the cylinder 22 via the directional control valve 16. The bore end 46 of the cylinder 22 is connected to the reservoir 12 via the load holding valve 14. The outlet 54 of the pump 26 is connected to the reservoir 12 via a pair of relief valves 18, 20.

Figure 7:
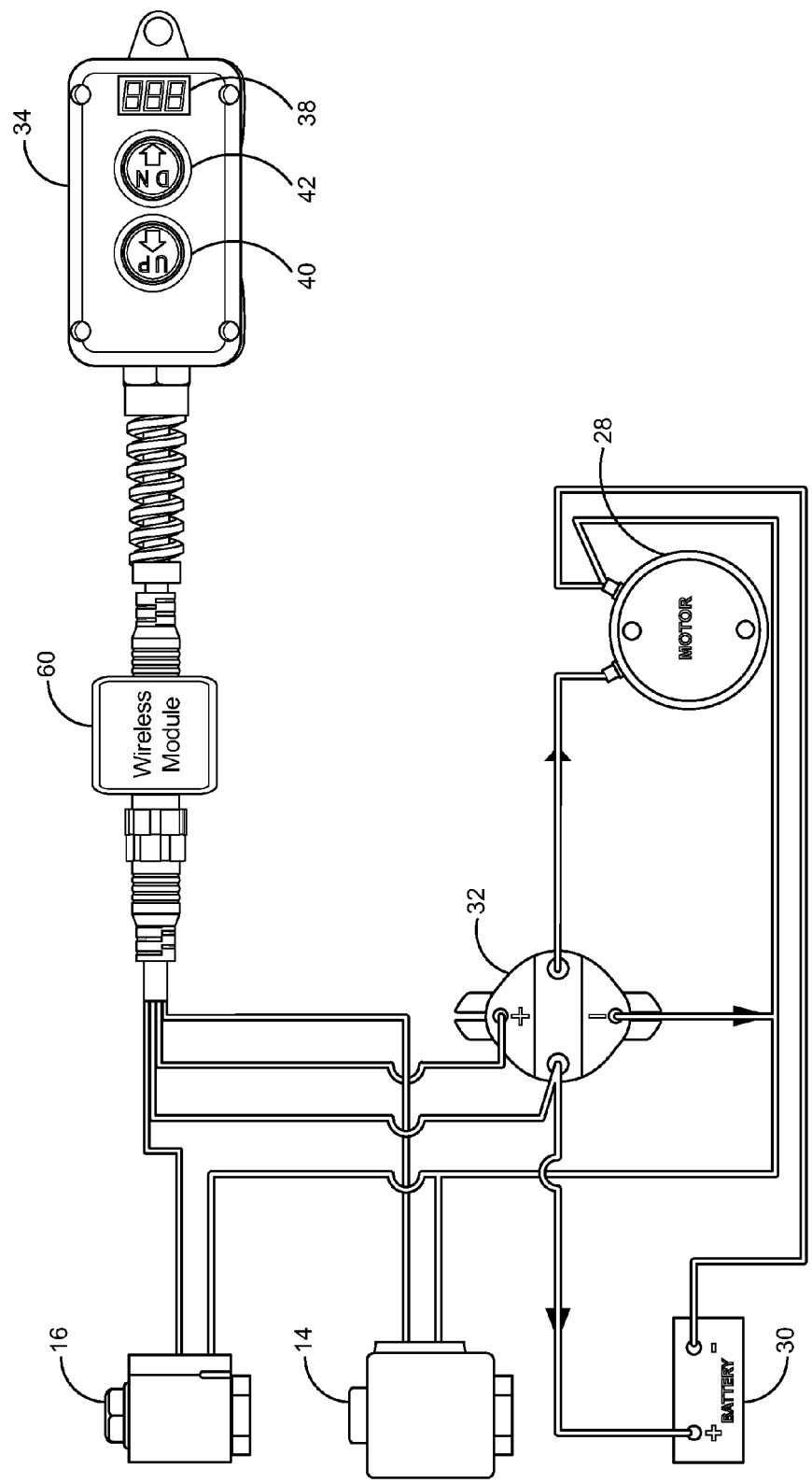
FIG. 7 is a schematic diagram illustrating the electrical connections between the hydraulic power unit and the digital remote.

FIG. 7 is a schematic diagram illustrating the electrical connections between the hydraulic power unit 10 and the digital remote 34. The battery 30 is connected to the motor 28 via the start solenoid 32. The digital remote 34 is connected to the hydraulic power unit 10 via the directional control valve 16 and the load holding valve 14 and to the battery 30 through the start solenoid 32.

When the remote up button 40 on the digital remote 34 is pressed, the start solenoid 32, the motor 28 and the round coil 50 get power at the same time. When the start solenoid 32 is activated, power is provided to the motor 28 which turns the pump 26 to build pressure. When the round coil 50 is activated, the directional control valve 16 gets shifted allowing the fluid to travel through the normally closed 2-way section of the load holding valve 14 and a first port 56 which extends the cylinder 22. When the pump 26 is building pressure to extend the cylinder 22, the load holding valve 14 is opened to allow fluid from rod end 44 of the cylinder 22 to travel back to the reservoir 12. When the cylinder 22 reaches the end of its stroke or maximum load, fluid will bypass to the reservoir 12.

When the remote down button 42 on the digital remote 34 is pressed, the start solenoid 32, the motor 28 and the square coil 48 get power. When the start solenoid 32 is activated, power is provided to the motor 28 which turns the pump 26 to build pressure. Fluid flows through the directional control valve 16 then through the lower section of load holding valve 14 and through a second port 58 retracting the cylinder 22. When the square coil 48 is energized, the normally closed 2-way section of the load holding valve 14 is opened thereby allowing fluid to return through directional control valve 16 and back to the reservoir 12. When the cylinder 22 reaches the end of its stroke fluid bypasses to the reservoir 12 via the secondary relief valve 20. The secondary relief valve 20 is in place to prevent over pressurization of rod end 44 of cylinder 22 and thermal expansion.

Continuous usage of the hydraulic power unit 10 causes low voltage at the battery. Low voltage causes high current to be drawn from the battery 30 which produces heat and reduce the speed of the motor 28. Low voltage causes carbon buildup on contacts of the start solenoid 32, the round coils 50 and causes failure of the directional control valve 16.

Pressing the remote up button 40 of the digital remote 34 provides voltage reading across the battery 30 during the upstroke of the hydraulic cylinder 22 and pressing the remote down button 42 provides the voltage reading during the down stroke of the hydraulic cylinder 22. The hydraulic power unit 10 normally employs a 12V or 24V battery. In the case of a 12V battery, the optimal operation is from 12.5V to 8V and potential failure may occur at less than 8V. In the case of a 24V battery, the optimal operation is from 24.5V to 16V and potential failure may occur at less than 16.5V. The digital display 38 of the digital remote 34 indicates a minimum voltage at which the usage of hydraulic power unit 10 may be discontinued and the battery 30 is recharged.

The presently disclosed hydraulic power unit 10 with voltage detection is advantageous because it provides the status of the battery 30 in real time through RF or Bluetooth communication when operating the hydraulic power unit 10. The digital remote 34 registers the minimum voltage across the battery 30 and prevents arcing across the contact points. The presently disclosed hydraulic power unit 10 allows the user 68 to determine when the operation of the hydraulic system should be stopped, when the battery 30 needs to be charged and thereby preventing damage to the start solenoid, the motor, and eliminates a fire hazard.

The foregoing description of the preferred embodiment of the present invention has been presented for the purpose of illustration and description. It is not intended to be exhaustive or to limit the invention to the precise form disclosed. Many modifications and variations are possible in light of the above teachings. It is intended that the scope of the present invention not be limited by this detailed description, but by the claims and the equivalents to the claims appended hereto.

What is claimed is:

1. A voltage detector assembly employed in hydraulic systems, comprising:
    a hydraulic power unit comprising:
        a hydraulic cylinder having a piston;
        a hydraulic fluid reservoir having hydraulic fluid and connected with the hydraulic cylinder; and
        a pump operated by a motor connected with the hydraulic fluid reservoir, the pump pumps the hydraulic fluid from the hydraulic fluid reservoir to the hydraulic cylinder;
    a battery connected to the hydraulic power unit by means of a start solenoid, the start solenoid transfers power from the battery to the motor;
    a digital remote connected to the hydraulic power unit and the battery through the start solenoid;
    a wireless module having a radio frequency (RF) wireless unit and a Bluetooth transmitter/receiver connected with the digital remote and the start solenoid; and
    a portable security device wirelessly coupled with the wireless module;
    the digital remote and the wireless module being designed to register and indicate available battery voltage level of the hydraulic power unit in real-time during upstroke and down stroke of the hydraulic system.

2. The voltage detector assembly of claim 1 wherein the wireless module transmits the battery voltage level of the hydraulic power unit to the portable security device of the user through wireless communication.

3. The voltage detector assembly of claim 1 wherein the portable security device is selected from a group consisting of: a key fob and a cell phone.

4. The voltage detector assembly of claim 1 wherein the portable security device is designed to make RF and Bluetooth communication with the wireless module.

5. The voltage detector assembly of claim 1 wherein the piston is positioned inside the hydraulic cylinder.

6. The voltage detector assembly of claim 1 wherein the hydraulic fluid reservoir includes a pair of control valves and a pair of relief valves.

7. The voltage detector assembly of claim 6 wherein the pair of control valves includes a load holding valve and a directional control valve.

8. The voltage detector assembly of claim 6 wherein the pair of relief valves includes a primary relief valve and a secondary relief valve.

9. The voltage detector assembly of claim 1 wherein the digital remote includes a circuit board, a digital display, a remote up button and a remote down button.

10. The voltage detector assembly of claim 1 wherein pressing the remote up button provides voltage reading across the battery during the upstroke of the hydraulic cylinder.

11. The voltage detector assembly of claim 1 wherein pressing the remote down button provides the voltage reading during the down stroke of the hydraulic cylinder.

12. The voltage detector assembly of claim 1 wherein the battery is be selected from a group consisting of: 12 volt and 24 volt.

13. The voltage detector assembly of claim 1 wherein the digital display indicates a minimum voltage at which usage of the hydraulic power unit to be discontinued and the battery to be recharged.

14. A voltage detector assembly employed in hydraulic systems, comprising:
    a hydraulic power unit comprising:
        a hydraulic cylinder having a piston, the piston positioned inside the hydraulic cylinder;
        a hydraulic fluid reservoir containing hydraulic fluid, the hydraulic fluid reservoir having a pair of control valves and a pair of relief valves, the hydraulic fluid reservoir connected with the hydraulic cylinder; and
        a pump operated by a motor connected with the hydraulic fluid reservoir, the pump pumps the hydraulic fluid from the hydraulic fluid reservoir to the hydraulic cylinder;
    a battery connected to the hydraulic power unit by means of a start solenoid, the start solenoid transfers power from the battery to the motor of the hydraulic power unit;
    a digital remote having a circuit board, a digital display, a remote up button and a remote down button, the digital remote connected to the hydraulic power unit and the battery through the start solenoid;
    a wireless module having a radio frequency (RF) wireless unit and a Bluetooth transmitter/receiver connected with the digital remote and the start solenoid; and a portable security device wirelessly coupled with the wireless module;

the digital remote and the wireless module being designed to register and indicate available battery voltage level of the hydraulic power unit in real-time during upstroke and down stroke of the hydraulic system.

15. The voltage detector assembly of claim 14 wherein the wireless module transmits the battery voltage level of the hydraulic power unit to the portable security device of the user through wireless communication.

16. The voltage detector assembly of claim 14 wherein the portable security device is selected from a group consisting of: a key fob and a cell phone.

17. The voltage detector assembly of claim 14 wherein the pair of control valves includes a load holding valve and a directional control valve.

18. The voltage detector assembly of claim 14 wherein the pair of relief valves includes a primary relief valve and a secondary relief valve.

19. The voltage detector assembly of claim 14 wherein pressing the remote up button provides voltage reading across the battery during the upstroke of the hydraulic cylinder.

20. The voltage detector assembly of claim 14 wherein pressing the remote down button provides the voltage reading during the down stroke of the hydraulic cylinder.

21. The voltage detector assembly of claim 14 wherein the battery may be selected from a group consisting of: 12 volt and 24 volt.

22. The voltage detector assembly of claim 14 wherein the digital display indicates a minimum voltage at which the usage of the hydraulic power unit is discontinued and the battery is recharged.

23. A method for assembling a system for detecting voltage in hydraulic systems, the method comprising the steps of:
   a) connecting a motor to a pump having an outlet;
   b) connecting a reservoir to the pump;
   c) connecting the pump to a cylinder via a directional control valve;
   d) connecting the cylinder to the reservoir via a load holding valve;
   e) connecting the outlet of the pump to the reservoir via a pair of relief valves;
   f) connecting a battery to the motor via a start solenoid;
   g) connecting a digital remote to the directional control valve, the load holding valve and the battery through the start solenoid;
   h) connecting a wireless module having a radio frequency (RF) wireless unit and a Bluetooth transmitter/receiver with the digital remote and the start solenoid; and
   i) connecting the wireless module with a portable security device.

24. The method of claim 23 wherein the wireless module is wirelessly coupled with the portable security device.

25. The method of claim 23 wherein the portable security device is selected from a group consisting of: a key fob and a cell phone.

26. The method of claim 23 wherein the wireless module transmits the battery voltage level of the hydraulic power unit to the portable security device of the user through wireless communication.

27. The method of claim 23 wherein the start solenoid transfers power from the battery to the motor.

28. The method of claim 23 wherein the digital remote includes a circuit board, a digital display, a remote up button and a remote down button.

29. The method of claim 23 wherein pressing the remote up button provides voltage reading across the battery during the upstroke of the hydraulic cylinder.

30. The method of claim 23 wherein pressing the remote down button provides the voltage reading during the down stroke of the hydraulic cylinder.

31. The method of claim 23 wherein the digital display indicates a minimum voltage level at which the usage of the hydraulic unit to be discontinued and the battery to be recharged.

* * * * *